US006993704B2

(12) United States Patent
Wolf (10) Patent No.: US 6,993,704 B2
(45) Date of Patent: Jan. 31, 2006

(54) CONCURRENT MEMORY CONTROL FOR TURBO DECODERS

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 466 days.

(21) Appl. No.: 10/141,416

(22) Filed: May 8, 2002

(65) Prior Publication Data
US 2003/0208716 A1 Nov. 6, 2003

Related U.S. Application Data

(60) Provisional application No. 60/293,014, filed on May 23, 2001.

(51) Int. Cl.
H03M 13/03 (2006.01)

(52) U.S. Cl. ...................................... 714/794; 714/795

(58) Field of Classification Search ................ 714/794, 714/795; 375/262, 341
See application file for complete search history.

(56) References Cited

U.S. PATENT DOCUMENTS 6,516,444 B1 * 2/2003 Maru .......................... 714/795
6,598,204 B1 * 7/2003 Giese et al. ................. 714/795

OTHER PUBLICATIONS

J. Dielissen, et al.; *Power-Efficient Layered Turbo Decoder Processor*, IEEE Proc. of Conf. Design, Automation and Test in Europe; Los Alamitos, US, 13 Mar. 2001, pp. 246-251.
C. Schurgers, et al.; *Energy Efficient Data Transfer and Storage Organization for a MAP Turbo Decoder Module*, Proc. 1999 Int'l Symp. On Low Power Electronics and Design, San Diego, CA Aug. 16-17, 1999, pp. 76-81.
J. Vogt, et al.; *Comparision of Different Turbo Decoder Realization for LMT-2000*, Proc. of the Global Telecommunications Conf. 1999, GLOBECOM '99, vol. 5, Dec. 5, 1999, pp. 2704-2708.

* cited by examiner

Primary Examiner—Joseph Torres
(74) Attorney, Agent, or Firm—Robert D. Marshall, Jr.; W. James Brady, III; Frederick J. Telecky, Jr.

(57) ABSTRACT

The concurrent memory control turbo decoder solution of this invention uses a single port main memory and a simplified scratch memory. This approach uses an interleaved forward-reverse addressing which greatly relieves the amount of memory required. This approach is in marked contrast to conventional turbo decoders which employ either a dual port main memory or a single port main memory in conjunction with a complex ping-ponged scratch memory. In the system of this invention, during each cycle accomplishes one read and one write operation in the scratch memories. If a particular location in memory, has been read, then that location is free. The next write cycle can use that location to store its data. Similarly a simplified beta RAM is implemented using a unique addressing scheme which also obviates the need for a complex ping-ponged beta RAM.

1 Claim, 6 Drawing Sheets

CONCURRENT MEMORY CONTROL FOR TURBO DECODERS

This application claims priority under 35 USC §119(e)(1) of Provisional Application No. 60/293,014, filed May 23, 2001.

TECHNICAL FIELD OF THE INVENTION

The technical field of this invention is turbo decoders used in forward error correction.

BACKGROUND OF THE INVENTION

Figure 1:
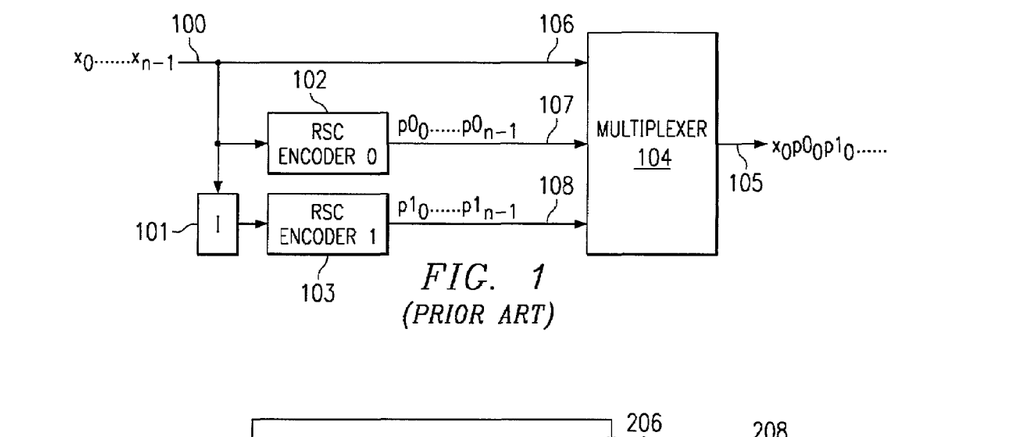
FIG. 1 illustrates the high level functional block diagram of a prior art turbo decoder.

Turbo codes are a type of forward error correction code with powerful capabilities. These codes are becoming widely used in many applications such as wireless handsets, wireless base stations, hard disk drives, wireless LANs, satellites, and digital television. Turbo codes consist of a concatenation of convolutional codes, connected by an interleaver, with an iterative decoding algorithm. An example of a prior art rate 1/3 parallel-concatenated encoder is shown in FIG. 1. Input data stream 100 ($x_m$) is supplied unmodified to multiplexer 104 at input 106. The two Recursive Systematic Convolutional (RSC) encoders 102 and 103 function in parallel to transform their respective input bit streams. After transformation by RSC encoders 102 and 103, the resulting bit streams are supplied to multiplexer 104 at inputs 107 and 108, respectively. Block 101 is an interleaver (I) which randomly re-arranges the information bits to decorrelate the noise for the decoder. RSC encoders 102 and 103 generate respective $p0_m$ and $p1_m$ bit streams. Multiplexer 104 reassembles these $x_m$, $p0_m$ and $p1_m$ bit streams into a resulting output bit stream 105 ($x_0$, $p0_0$ and $p1_0$ ...).

Figure 2:
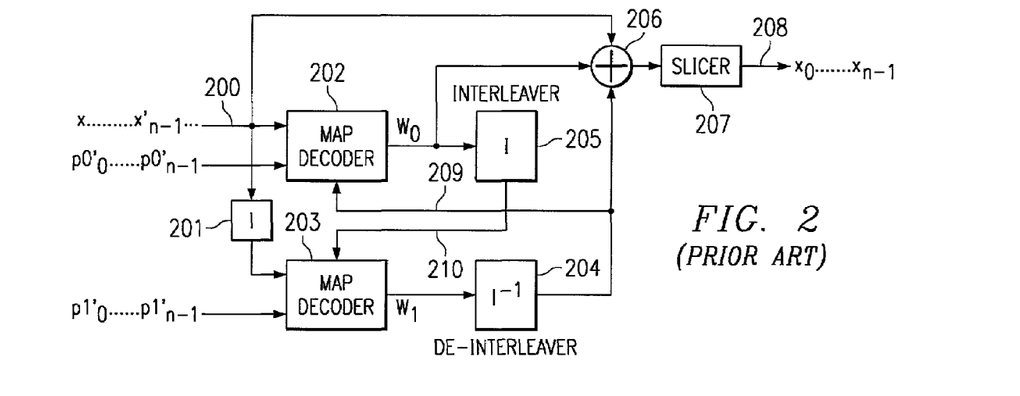
FIG. 2 illustrates a lower level functional block diagram of a prior art turbo decoder.

FIG. 2 illustrates a functional block diagram of a prior art turbo decoder 200. Iterative turbo decoder 200 generates soft decisions from a pair of maximum-a-posteriori (MAP) blocks 202 and 203. Each iteration requires the execution of two MAP decodes to generate two sets of extrinsic information. The first MAP decoder 202 uses the non-interleaved data as its input and the second MAP decoder 203 uses the interleaved data from the interleaver block 201 as its input. The MAP decoders 202 and 203 compute the extrinsic information as:

$$W_n = \log \frac{\Pr(x_n = 1 \mid R_1^n)}{\Pr(x_n = 0 \mid R_1^n)} \quad [1]$$

where: $R_1^n = (R_0, R_1, \ldots R_n)$, which are the received symbols. MAP decoders 202 and 203 also compute the a posteriori probabilities:

$$\Pr(x_n = 1 \mid R_1^n) = \frac{1}{\Pr(R_1^n)} \sum \Pr(x_n = i, S_n = m', S_{n-1} = m) \quad [2]$$

where: $S_n$ is the state at time n in the trellis of the constituent convolutional code.

The terms in the summation can be expressed in the form $$Pr(x_n=i, S_n=m', S_{n-1}=m)=\alpha_{n-1}(m)\gamma_n^i(m,m')\beta_n(m') \quad [3]$$

where: the quantity $$\gamma_n^i(m,m')=Pr(S_n=m', x_n=i, R_n|S_{n-1}=m) \quad [4]$$

is called the branch metric, the quantity $$\alpha_n(m')=Pr(S_n=m', R_1^n) \quad [5]$$

is called the forward (or alpha) state metric, and the quantity $$\beta_n(m')=Pr(R_{n+1}^n|S_n=m') \quad [6]$$

is called the backward (or beta) state metric.

The branch metric depends upon the systematic, parity, and extrinsic symbols. The extrinsic symbols for each MAP decoder are supplied to the other MAP decoder at inputs 209 and 210. De-interleaver 204 receives the output $W_1$ of MAP decoder 203 and supplies input 209 to MAP decoder 202. Interleaver 205 receives the output $W_0$ of MAP decoder 202 and supplies the input 210 to MAP decoder 203. The alpha and beta state metrics are computed recursively by forward and backward recursions given by:

$$\alpha_n(m') = \sum_{m',i} \alpha_{n-1}(m)\gamma_n^i(m, m') \quad [7]$$

and $$\beta_{n-1}(m) = \sum_{m',i} \beta_n(m')\gamma_n^i(m, m') \quad [8]$$

Adder 206 adds the non-interleaves input data, $W_0$ from MAP decoder 202 and input 209 from de-interleaver 204. The slicer 207 receives the output of adder 206 and completes the re-assembling of the output bit stream 208 ($x_0$, $x_1 \ldots x_{n-1}$).

Figure 3:
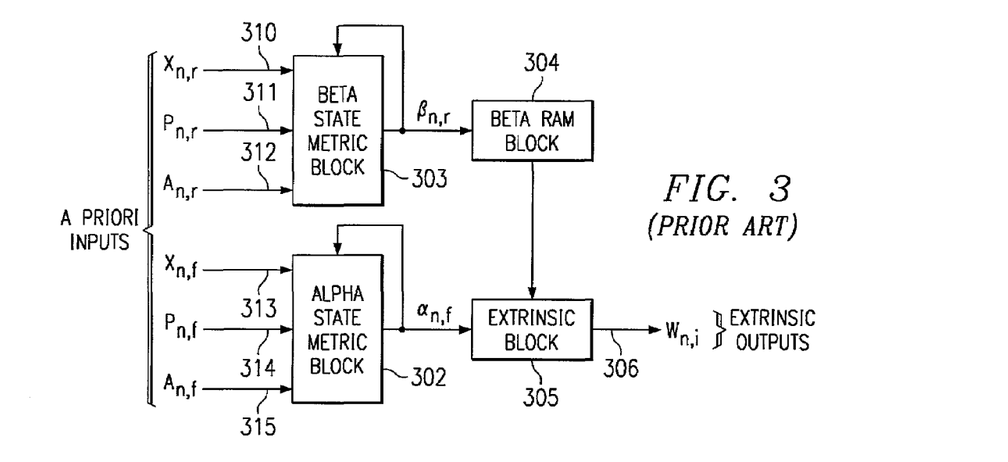
FIG. 3 illustrates a functional block diagram of a prior art MAP decoder.

FIG. 3 illustrates a block diagram of a prior art MAP decoder. The subscripts r and f represent the direction, reverse and forward, respectively, of the sequence of the data inputs for the recursive blocks beta and alpha. Input bit streams 310 to 312 are labeled as parameters $X_{n,r}$, $P_{n,r}$ and $A_{n,r}$, respectively. Input bit streams 313 to 315 are labeled as parameters $X_{n,f}$, $P_{n,f}$ and $A_{n,f}$, respectively. The feedback stream from alpha state metric block 302 is labeled $\alpha_{n,f}$. The feedback stream from beta state metric block 303 is labeled $\beta_{n,r}$. Both the alpha state metric block 302 and beta state metric block 303 calculate state metrics. Both start at a known location in the trellis, the zero state. The encoder starts the block of n information bits (for example, n=5114, the frame size) at the zero state and after n cycles through the trellis ends at some unknown state.

Without sliding windows, the frame size of the block would contain nxsxd=327,296 bits. With sliding windows, the processing involves rxsxd=8192 bits where r is 128. Clearly, the memory size requirements are greatly reduced through the use of sliding windows.

A number of tail bits t are appended to the encoder data stream to force the encoder back to the zero state. For a constraint length k code, t=k−1, there are systematic tail bits for each RSC encoder. For an eight state code, k=4, t=3 which is assumed for the remainder of this description. Alpha state metric block 302 will process the received data from 0 to n+2 and beta state metric block 303 will process the data from to n+2 to 0.

The beta state metrics are generated first by beta state metric block 303. These beta metrics are generated in reverse order and stored in the beta state metric RAM 304. Next, the alpha state metrics are generated by alpha state metrics block 303. The alpha state metrics are not stored because extrinsic block 305 uses this data as soon as it is generated.

The beta state metrics are read in a forward order at the same time as the alpha state metrics are generated. Extrinsic block 305 uses both the alpha and beta state metrics in a forward order to generate the extrinsic outputs 306 $W_{n,i}$. This implementation requires a large main memory RAM supplying the a-priori inputs 310 to 315. The main memory size is computed as listed in Table 1.

TABLE 1

| Main Memory Size | Number of Bits |
|---|---|
| $X_0$ | 5120 × 8 = 40,960 |
| $P_0$ | 5120 × 8 = 40,960 |
| $P_1$ | 5120 × 8 = 40,960 |
| $A_0$ | 5120 × 8 = 40,960 |
| $A_1$ | 5120 × 8 = 40,960 |
| I | 5120 × 13 = 66,560 |
| SX | 176 × 45 × 4 = 31,680 |
| $P_2$ | 2560 × 8 = 20,480 |
| $P_3$ | 2560 × 8 = 20,480 |
| Totals | 344,000 bits |

Figure 4:
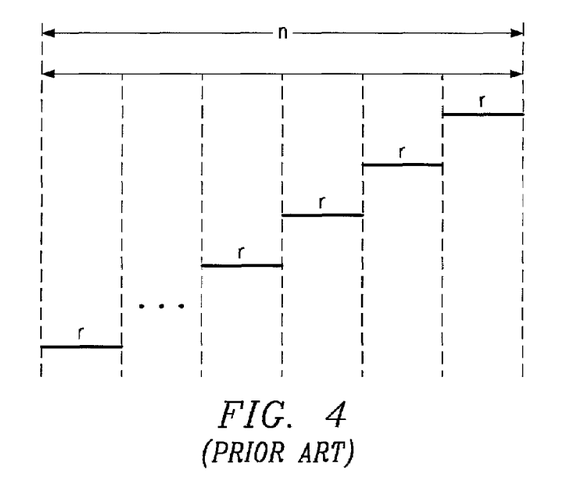
FIG. 4 illustrates breaking a block of size n into sliding window blocks of size r according to the prior art.

The size of the beta state metric memory can also be reduced by using the sliding block implementation. The block of size n is broken into smaller pieces of size r shown in FIG. 4. Each smaller block of size r, called the reliability size, can be processed independently of each other by adding a prolog section of size p to each block of r.

Figure 5:
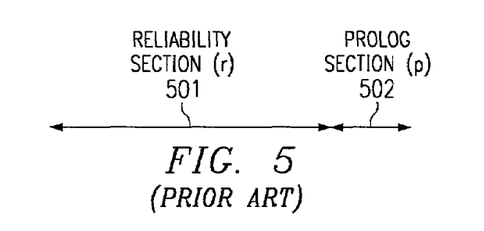
FIG. 5 illustrates the make-up of a prior art beta sliding block.

The sliding window block is shown in FIG. 5. The reliability size 501 is r. The prolog size 502 is p and is usually equal to 4 times to 6 times the constraint length. Upon setting all the state metrics to a zero and then executing the prolog, the resulting state metric has a high probability of being in the correct state. This block has a size of r+p. The size of the beta state metric memory will drop to r×8×d. Note that the state metrics for the beta prolog section are not stored.

Figure 6:
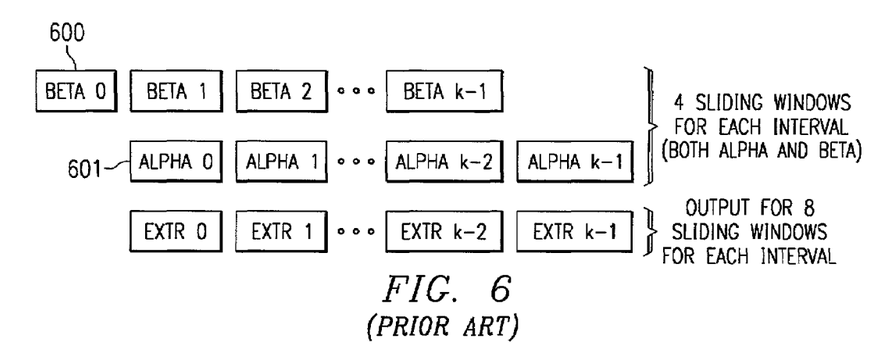
FIG. 6 illustrates the prior art processing of beta and alpha sub-blocks versus time.

The turbo decoder controller is required to process an entire frame of data. If the frame is large, then it must be processed into k smaller pieces or sub-blocks as shown in FIG. 6. Each sub-block such as 600 or 601 consists of four sliding windows in this example. Of course, other groupings of sliding windows could have been used.

Figure 7:
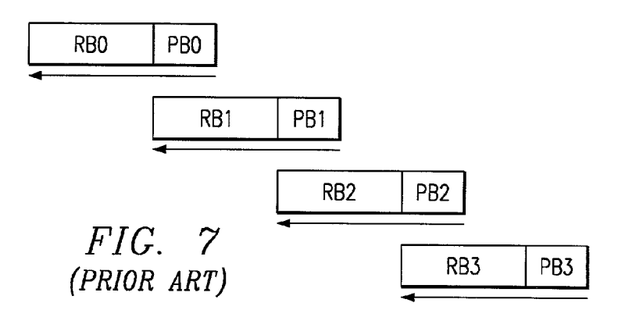
FIG. 7 illustrates the prior art processing of four beta sliding windows in parallel.
Figure 8:
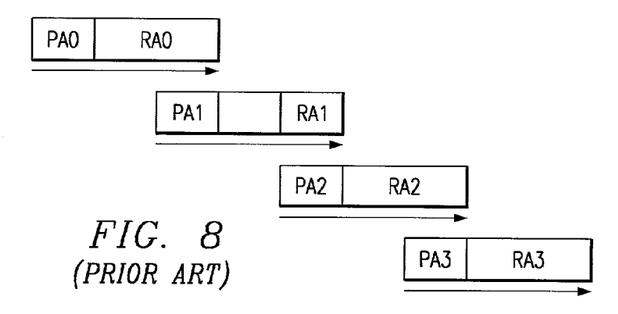
FIG. 8 illustrates the prior art processing of four alpha sliding windows in parallel.

The beta sub-block must be processed and stored before the alpha and extrinsic (labeled extr in FIG. 6) sub-blocks can start. Therefore, it takes some amount of time units to process k sub-blocks. Each sub-block consists of four sliding windows that are shown in FIG. 7 and FIG. 8. The arrows represent the processing order. RBx is the abbreviation for the reliability section for beta and PBx is the abbreviation for the prolog section for beta. FIG. 8 illustrates the corresponding labels for alpha metrics.

When both beta and alpha sub-blocks are being processed simultaneously, the data memories must be accessed twice. Unfortunately, the addresses are different thus requiring a dual port memory. Other solutions are possible using a single port main memory combined with a combination of scratch memory blocks. Such implementations are hampered by the complexity involved in meeting the required addressing order. The scratch memory would include four separate memory blocks, one for each sliding window. Each of the scratch memory blocks would have 176 addressable locations; the sum of the maximum sizes for reliability and prolog. Each one of the four scratch memory blocks would store the data for one of the four alpha sliding windows.

The difficulty with this solution is that the beta data is written to the scratch memories in a reverse order and the alpha data is read in a forward order. This would require two memories for each sliding window to insure that the data is being processed correctly. During processing of the first sub-block, one of the memories is performing a write. During processing of the second sub-block, the full memory is read from for alpha processing and the other memory is written to for future alpha processing. During the processing of the next sub-block, the operation of the memories is reversed. This technique is call ping-ponging of memories. The memories are ping-ponged until each sub-block has been processed.

Figure 9:
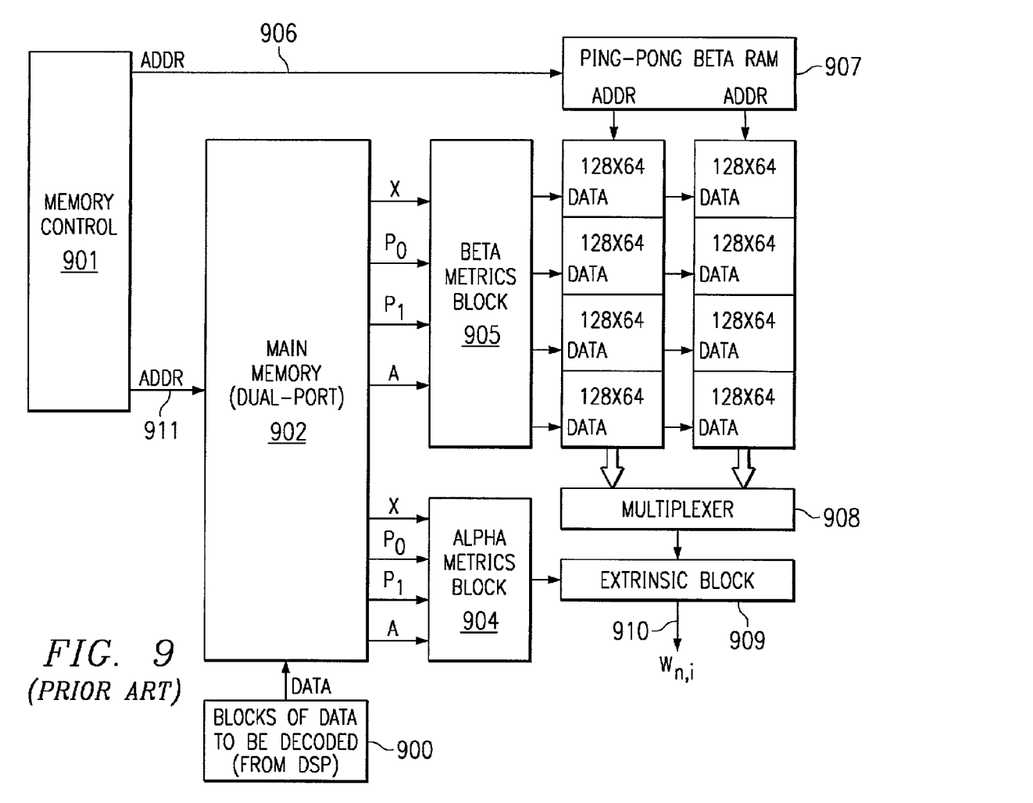
FIG. 9 illustrates the prior art use of ping-pong scratch memory in a four-sliding-windows conventional turbo decoder.

A conventional turbo decoder using the dual port main memory approach is illustrated in FIG. 9. Blocks of data to be decoded 900 come from the digital signal processor (DSP) to the main memory 902. Main memory 902 is a dual-port RAM. Memory control block 901 generates both addresses 911 for main memory 902 and addresses 906 the beta RAM 907. Data is passed to the alpha metrics block 904 and the beta metrics block 905 from two separate ports of main memory 902. Beta metrics block 905 writes its output to beta RAM 907 and the alpha metrics block 904 passes its output directly to the extrinsic block 909. Because the output of beta metrics block 905 is used in the order described in FIGS. 6 and 7, a ping-pong beta RAM of a full 8-block size must be used. The multiplexer 908 provides interface between the eight separate portions of beta memory 907 and extrinsic block 909. Extrinsic block 909 completes computation of metric output parameters 910 $W_{nj}$.

To avoid loss of processor cycles, the conventional turbo decoder system of FIG. 9 requires a dual port main memory 902 having an array size almost double the size of a single port memory. It also requires an eight-block beta memory 907 because of the order in which beta metrics output is used in comparison to the order in which the alpha metrics output is used in computing output extrinsic data 910 $W_{nj}$.

SUMMARY OF THE INVENTION

This invention is a concurrent memory control solution for turbo decoders. A four-sliding windows preferred embodiment requires only a single port main memory, a scratch memory and a four-block beta memory. This is in contrast to conventional turbo decoders which would employ a dual port main memory and an eight block size ping-pong beta memory. During each cycle, one read and one write operation must happen for the scratch memories. If a particular location in memory, has been read, then that location is free. The next write cycle can use that location to store its data.

During processing of the first beta sub-block the data memories for the systematic, parities, and a-priori are read. The reliability portion of this data is written into the scratch memory in a reverse order. After the beta sub-block processing has finished, the alpha reliability data is loaded into the scratch RAM, but not the alpha prolog data. The turbo decoder controller starts a new state in which the alpha prolog data is read from the data memories and the data is stored in the scratch RAM. The maximum size of each of the scratch memories is equal to the maximum sum of the reliability and prolog sizes. A solution for the addressing requirements for interleaved forward and reverse addressing order are also described.

BRIEF DESCRIPTION OF THE DRAWINGS

These and other aspects of this invention are illustrated in the drawings, in which.

DETAILED DESCRIPTION OF PREFERRED EMBODIMENTS

Figure 10:
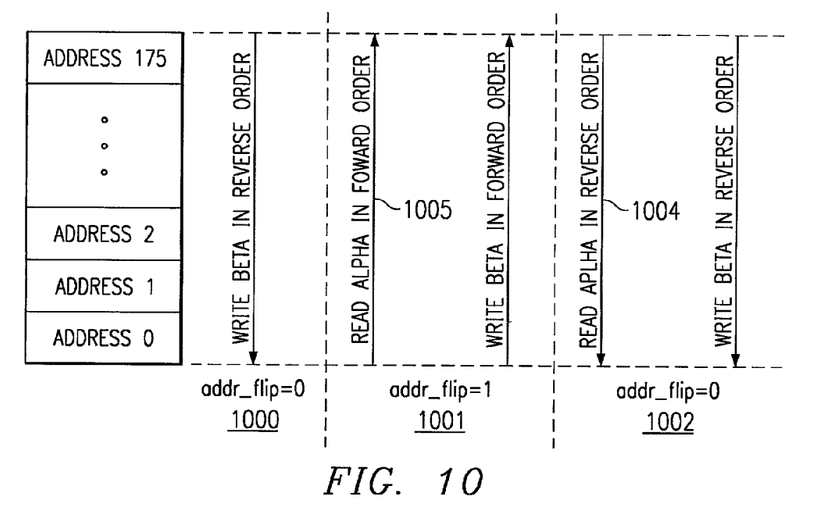
FIG. 10 illustrates the physical address order of scratch RAM in a first embodiment of this invention.

With four sliding windows assumed, FIG. 10 illustrates the physical address order of scratch RAM for the preferred embodiment. Beta processing state takes a maximum of $$((128+48)\times4)+12=716 \text{ cycles} \quad [9]$$

and the alpha prolog processing state takes $$(48\times4)+8=200 \text{ cycles.} \quad [10]$$

The 12 term in equation 9 and the 8 term in equation 10 arise from the extra cycles needed to setup the respective states. The 4 factor in equation 9 represents the number of sliding windows in this implementation. The main data memories are read $((128+48)\times4)=704$ times and the scratch memories are written $(128\times4)=512$ times during the beta processing state. The beta prolog data is not stored in the scratch memories during the beta processing state.

The problem of the write and read order is solved with the addition of virtual addresses. The virtual addresses for the beta are always indexed in the reverse order and the virtual addresses for the alpha are always indexed in the forward order. But, the physical addresses are mapped depending on signal addr_flip. Referring to FIG. 10, the binary signals addr_flip 1000, addr_flip 1001, addr_flip 1002 toggle for each sub-block which causes the write and read order to change. When addr_flip is a 0, the physical addresses for both beta writes and alpha reads accesses the memory in reverse order 1004. When the addr_flip state is a logic 1, the physical addresses will access the memory in forward order 1005. This addressing scheme allows the scratch memory to be implemented with only one memory. There is one scratch memory for each of the four sliding blocks. This technique is also used for the beta state metric memory.

The disadvantage of the above addressing scheme is that it takes cycles. The MAP decoder is not being used during the 200 cycles it takes to store the alpha prolog data. This is a waste of 21.8% of the cycles.

Figure 11:
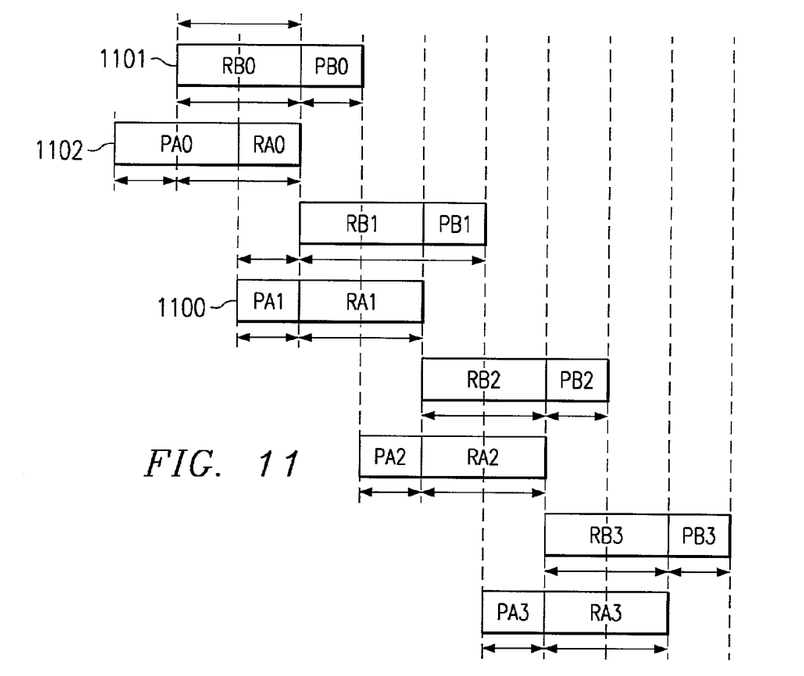
FIG. 11 illustrates the processing of four beta sliding windows in parallel for a second embodiment of this invention.

Referring to FIG. 11, the alpha prolog data for sliding window 1 (PA1) 1100 is part of the beta reliability data for sliding window 0 (RB0) 1101. Storing this data to the scratch memories during the beta processing state eliminates this function in the alpha prolog state. This eliminates 716+200=916 cycles from the alpha prolog state. This technique obviates the need for only three of the four alpha prolog sections because the data for the first alpha prolog sliding window (PA0) 1102 is not available during the beta processing state.

Further, the physical addressing in FIG. 10 will not function properly with this solution. Writing the prolog alpha sections early in the beta processing state overwrites the previously stored reliability data from the last sub-block. This overwriting cannot be allowed because it causes the MAP decoder to function improperly.

Figure 12:
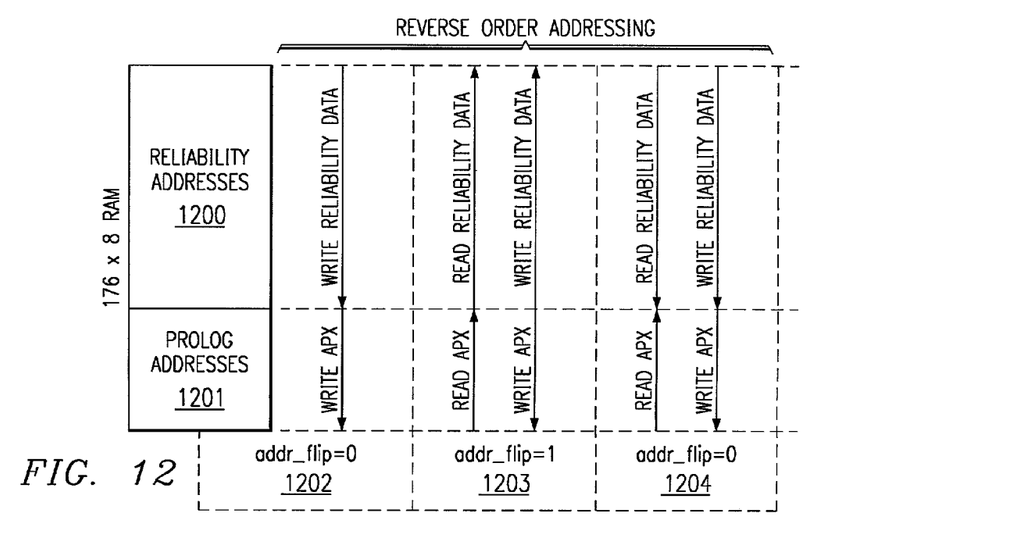
FIG. 12 illustrates the physical address order of scratch RAM for the second embodiment of this invention.

FIG. 12 shows a solution which avoids this difficulty. The scratch memory is divided into two regions. One region 1200 is for the reliability data and the other region 1201 is for the prolog data. The reliability region 1200 is controlled in a similar fashion as described above. The only difference is that the reliability address pointer is not allowed to go into the prolog address region 1201. The reliability address is still controlled by the addr_flip signals 1202, 1203 and 1204, as shown in FIG. 12.

Figure 13:
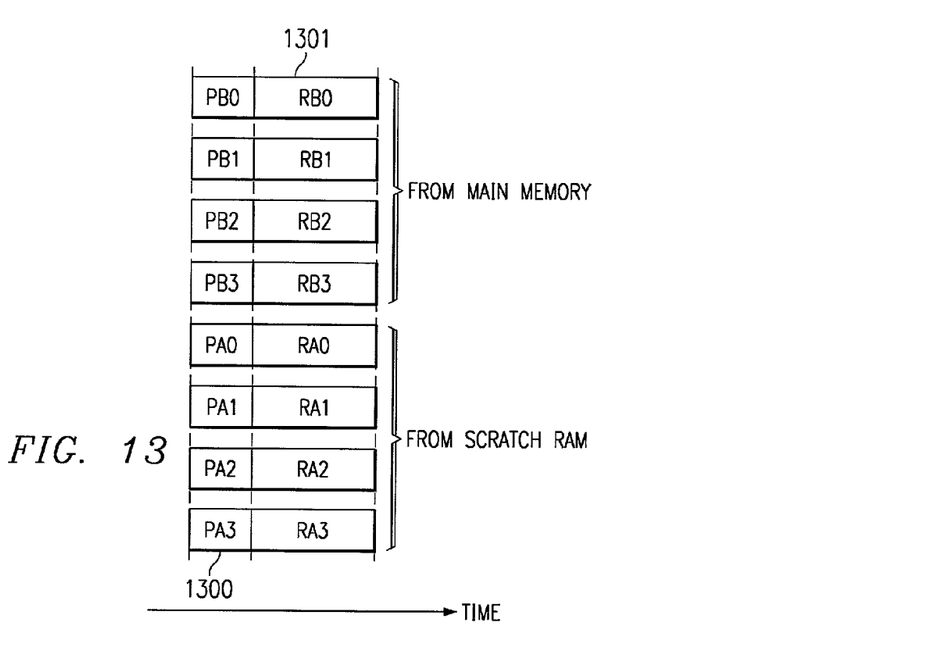
FIG. 13 illustrates the processing of beta and alpha sliding windows versus time.

A second address pointer for prolog address region 1201 is added. The reading and writing of data to the prolog address region 1201 is simpler than to the reliability address region 1200. The reading and writing of prolog data with respect to time never overlap with each other as shown in FIG. 13. Both the alpha and beta prolog data are read and processed at the beginning of the state 1300. The beta prolog data is not stored in the alpha scratch RAMs. Once the alpha prolog section has finished executing, then the prolog section is free in the scratch memory. When the beta starts the beta reliability section during time frame 1301, this data is stored twice, once in the current sliding window reliability address region 1200 and then in the next sliding window prolog address region 1201. The first part of the beta reliability data is the alpha prolog address region 1201 for the next sub-block as shown in FIG. 11.

This requires a new memory addressing technique with two writes and one read operation every cycle during the critical part of the reliability section. There are four scratch memories, one for each of the alpha sliding windows. Offsetting the three accesses to a single memory by one cycle allows this system to perform properly. Therefore, three out of the four scratch memories are accessed during every cycle. Each one is accessed only once, therefore, allowing the physical implementation of the memory to be simple.

This new technique requires 716+56=772 cycles. This is a savings of 144 cycles over the number of cycles required in the first embodiment of the invention. These 144 cycles become significant when summing the number of cycles it takes to complete a turbo decode. For example, if the frame length is 5114 and 10 iterations are performed, each turbo decode requires the following number of cycles shown in Table 2.

The second embodiment of this invention requires fewer cycles compared to the first embodiment. That is a 13.3% cycle improvement.

TABLE 2

| State | Equation for Second Embodiment | Number of Cycles for First Embodiment | Number of Cycles for Second Embodiment |
|---|---|---|---|
| Determine sliding windows pointers | (10 + 1) × 4 | 44 | 44 |
| beta, alpha, extrinsic processing | (10 + 1)((128 + 48) × 4 + 12) | 7876 | 7876 |
| load alpha prolog data for sliding window '0' | (9)((48 × 1) + 8) + (2 × 3) |  | 510 |
| 4 Sliding Windows | (9)((48 × 4) + 8) + (2 × 3) | 1806 |  |
| wait for extrinsics | (10 × 1) + (1 × 2) | 12 | 12 |
| start new sub-block | 11 × 1 | 11 | 11 |
| wait for stopping criteria | 10 | 10 | 10 |
| Total per MAP decode | m | 9,759 | 8,463 |
| Total per Iteration | i = 2 × m | 19,518 | 16,926 |
| Total per 10 iterations | 10 × i | 195,180 | 169,260 |

Figure 14:
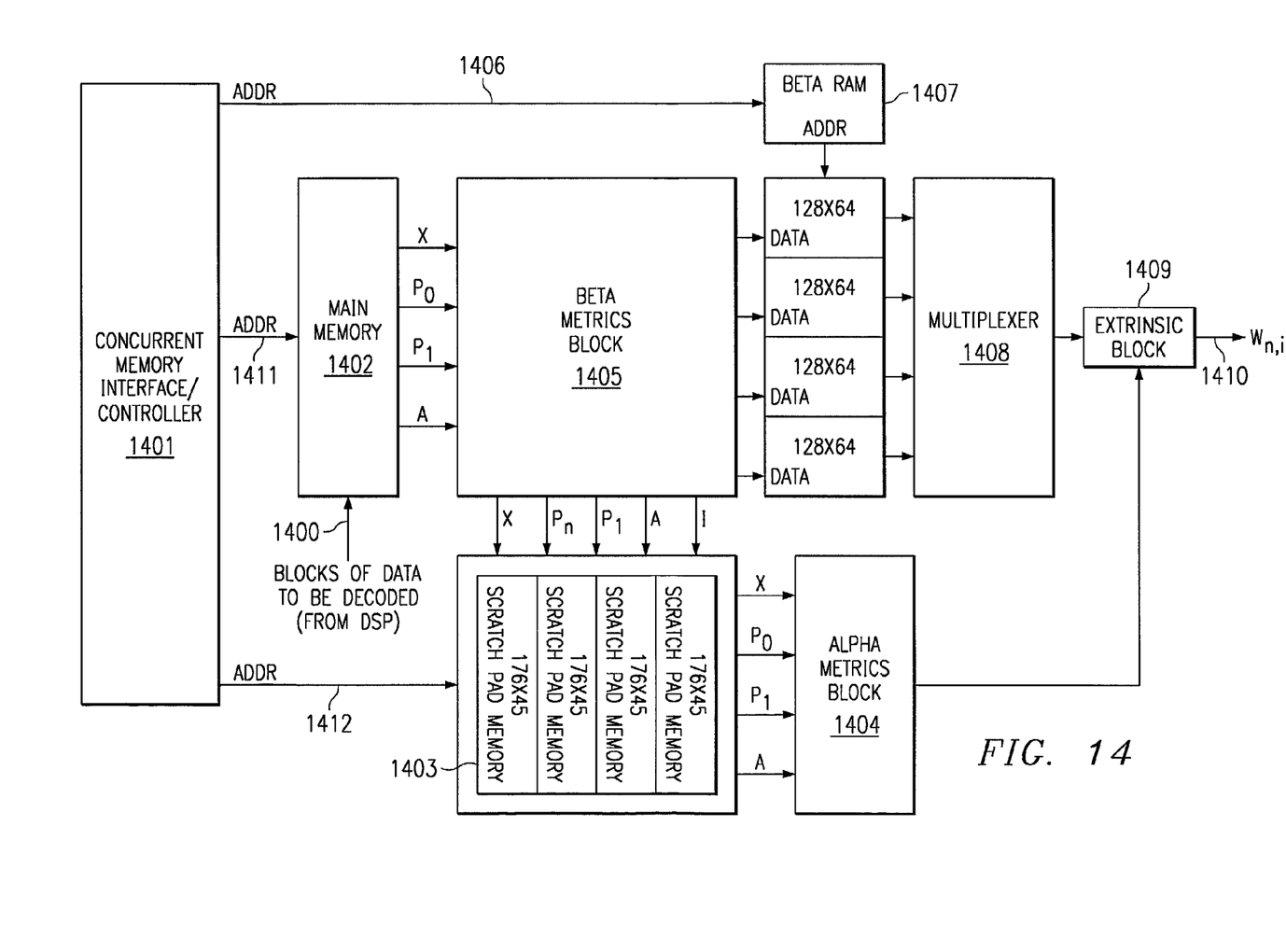
FIG. 14 illustrates the concurrent memory control of this invention with interfacing for main memory, scratch memories and beta memory in a four-sliding-windows turbo decoder.

FIG. 14 illustrates a block diagram of a MAP decoder architecture using the concurrent memory control of a preferred embodiment of this invention. This preferred embodiment is a four-sliding-windows architecture which requires four scratch memories and four beta memories. Four sliding window data is efficiently processed in a four-cycle beta metrics block architecture. FIG. 14 is an expanded view of FIG. 3, showing blocks of data to be decoded 1400 coming from the digital signal processor (DSP) to main memory 1402. Concurrent memory controller 1401 provides addresses 1411 for main memory 1402, addresses 1412 for scratch memory 1403 and addresses 1406 for beta RAM 1407. Alpha metrics block 1404 and beta metrics block 1405 both interface with the scratch memory 1403. Beta metrics block 1405 writes to scratch memory 1403 and alpha metrics block 1404 reads from scratch memory 1403. Concurrent memory interface controller 1401 controls all memory operations in main memory 1402, scratch memory 1403 and controls beta RAM 1407. Scratch memory 1403 employs 45 bit scratch memory words consisting of systematic bits (8), parity bits (8×2=16), a-priori bits (8) and interleaver data (13). The interleaver data is the extrinsic data address used when storing the extrinsic information. Concurrent memory controller 1401 drives the flow of data according to the prescription of FIGS. 10 through 12. It performs control and address generation for all three memory blocks. Multiplexer 1408 provides interface between the four separate portions of beta memory 1407 and the extrinsic block 1409. Extrinsic block 1409 completes computation of the metric output parameters 1410 $W_{nj}$.

Turbo coders are becoming widely used in many fields of communications. Turbo decoders are iterative decoders which execute the MAP decoder twice per iteration. The typical number of iterations ranges from 6 to 12. It is important to reduce the cycle count per decode which improves the system performance. A novel approach to limiting the number of memories required and a method of controlling the memories efficiently is described here. Most of the alpha prolog data and all of the alpha reliability data is folded into the cycles required to generate the beta state metrics. This reduces the cycle count of the decode.

What is claimed is:

1. A method of turbo decoding comprising the steps of:
(A) initially
   (1) computing beta state metrics for a sliding window of data,
   (2) setting a current physical addressing order to a first physical addressing order,
   (3) storing said beta state metrics for the sliding window of data in a scratch memory in the first physical addressing order;
(B) then repetitively for each sliding window
   (1) toggling the current physical addressing order for a current repetition between the first physical addressing order and a second physical addressing order, said second physical addressing order being opposite to said first physical addressing order,
   (2) computing alpha state metrics for the sliding window of data,
   (3) reading beta state metrics from the scratch memory in the current physical addressing order for the current repetition,
   (4) combining the computed alpha state metrics and the beta state metrics read from the scratch memory in an extrinsic block thereby producing extrinsic outputs,
   (5) computing beta state metrics for a next sliding window of data,
   (6) storing said beta state metrics for the next sliding window of data in a scratch memory in the current physical addressing order of the current repetition,
   until a frame of data including a plurality of sliding windows is decoded;
wherein:
the steps of (3) reading beta state metrics from the scratch memory in the current physical addressing order for the current repetition and (6) storing said beta state metrics for the next sliding window of data in a scratch memory in the current physical addressing order of the current repetition includes generating a virtual address and mapping the virtual address to a physical address; and
the step of toggling the current physical addressing order for a current repetition includes toggling a digital state of an address flip bit controlling an order of mapping of the virtual address to the physical address, wherein
   storing said beta state metrics always occurs in a first virtual addressing order and is mapped to the first physical address order if the address flip bit has a first digital state and is mapped to the second physical address order if the address flip bit has a second digital state opposite to the first digital state, and
   reading said beta state metrics always occurs in a second virtual addressing order, the second virtual addressing order opposite to said third addressing order, and is mapped to the second physical address order if the address flip bit has the first digital state and is mapped to the first physical address order if the address flip bit has the second digital.

* * * * *